US007411224B2

United States Patent
Kim et al.

(10) Patent No.: US 7,411,224 B2
(45) Date of Patent: Aug. 12, 2008

(54) LIGHT EMITTING DIODE MODULE, BACKLIGHT ASSEMBLY HAVING THE SAME, AND DISPLAY DEVICE HAVING THE SAME

(75) Inventors: Gi-Cherl Kim, Yongin-si (KR); Sang-Yu Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/493,437

(22) Filed: Jul. 26, 2006

(65) Prior Publication Data

US 2007/0164291 A1    Jul. 19, 2007

(30) Foreign Application Priority Data

Jan. 18, 2006    (KR) .................. 10-2006-0005343

(51) Int. Cl.
*H01L 29/22*    (2006.01)
*H01L 33/00*    (2006.01)
*H01L 29/227*    (2006.01)
*H01L 29/24*    (2006.01)
*H01L 27/15*    (2006.01)
*H01L 29/26*    (2006.01)
*H01L 31/12*    (2006.01)
*H01L 29/267*    (2006.01)
*H01L 29/16*    (2006.01)

(52) U.S. Cl. .............. 257/99; 257/79; 257/81; 257/82; 257/95; 257/98; 257/100

(58) Field of Classification Search .......... 257/95, 257/98–100, 79, 81–82
See application file for complete search history.

(56) References Cited

U.S. PATENT DOCUMENTS

| | | | |
|---|---|---|---|
| 7,199,400 B2* | 4/2007 | Sasuga | 257/81 |
| 7,253,449 B2* | 8/2007 | Wu | 257/99 |
| 2006/0131602 A1* | 6/2006 | Ouderkirk et al. | 257/100 |
| 2006/0138621 A1* | 6/2006 | Bogner et al. | 257/678 |
| 2006/0243986 A1* | 11/2006 | Wall, Jr. | 257/79 |
| 2006/0250270 A1* | 11/2006 | Tangen | 340/815.45 |
| 2007/0025108 A1* | 2/2007 | Kinsford et al. | 362/294 |
| 2007/0057364 A1* | 3/2007 | Wang et al. | 257/701 |

* cited by examiner

*Primary Examiner*—Ida M Soward
(74) *Attorney, Agent, or Firm*—F. Chau & Associates, LLC

(57) ABSTRACT

A light emitting diode module, a backlight assembly having the light emitting diode module, and a display device having the backlight assembly. The light emitting diode module includes a light emitting device including a light emitting diode chip, a body that surrounds the light emitting diode chip, and a heat releasing member that is in contact with the light emitting diode chip and protrudes from the body. The light emitting diode module also includes a printed circuit board having a hole corresponding to a protruding end portion of the heat releasing member.

19 Claims, 8 Drawing Sheets

LIGHT EMITTING DIODE MODULE, BACKLIGHT ASSEMBLY HAVING THE SAME, AND DISPLAY DEVICE HAVING THE SAME

CROSS-REFERENCE TO RELATED APPLICATION

This Application claims priority from Korean Patent Application No. 10-2006-0005343, filed on Jan. 18, 2006, the contents of which are incorporated by reference herein in their entirety.

BACKGROUND OF THE INVENTION (a) Technical Field

The present disclosure relates to a light emitting diode module, and more particularly, to a light emitting diode module that is capable of improving heat releasing efficiency and durability, a backlight assembly having the light emitting diode module, and a display device having the backlight assembly.

(b) Discussion of the Related Art

There are various types of display devices. As semiconductor technology has been developed, a small-sized and light-weight liquid crystal display device with improved performance has been provided as a display device.

Liquid crystal display devices have a smaller size, lighter weight, and lower power consumption, when compared with cathode ray tube (CRT) display devices. The liquid crystal display device has been used in connection with almost all information processing apparatuses, for example, small-sized apparatuses, such as mobile phones and portable digital assistants (PDAs), and medium-sized or large-sized apparatuses, such as monitors and TV sets.

Since a non-emission type of display panel has been used in the liquid crystal display device, a backlight assembly is supplies light to the display panel.

A tube-shaped cold cathode fluorescent lamp (CCFL) or an external electrode fluorescent lamp (EEFL) has been used as a light source of the backlight assembly. A light emitting diode (LED) having high brightness also has been used as a light source of the backlight assembly. The light emitting diode may be used as a single device, and alternatively, a module including a plurality of light emitting diodes may be used. The light emitting diode used as a light source releases a large amount of heat. The heat may cause defects in the light emitting diode or shorten the life thereof. As a result, the heat may affect a display device having the light emitting diodes.

SUMMARY OF THE INVENTION

Embodiments of the present invention provide a light emitting diode module that is capable of improving heat releasing efficiency and durability, a backlight assembly having the light emitting diode module, and a display device having the backlight assembly.

According to an embodiment of the present invention, a light emitting diode module includes a light emitting device including a light emitting diode chip, a body that surrounds the light emitting diode chip, and a heat releasing member that is in contact with the light emitting diode chip and protrudes from the body, and a printed circuit board having a hole corresponding to a protruding portion of the heat releasing member.

The light emitting device may be mounted on one outer surface of the printed circuit board, and the protruding portion of the heat releasing member may pass through the hole.

The printed circuit board may include a base substrate and a wire line portion disposed on the base substrate, and the light emitting device may further include a lead portion that electrically connects the light emitting diode chip to the wire line portion.

The wire line portion may be disposed on one outer surface of the base substrate.

The wire line portion may be disposed on both outer surfaces of the base substrate.

The wire line portion may be disposed in an inner portion of the base substrate.

According to another embodiment of the present invention, a backlight assembly includes at least one light emitting diode module that emits light, an optical member that diffuses the light emitting from the light emitting diode modules, and a supporting member that contains and supports the light emitting diode modules and the optical member. Each of the light emitting diode modules includes a light emitting device including a light emitting diode chip, a body that surrounds the light emitting diode chip, and a heat releasing member that is in contact with the light emitting diode chip and protrudes from the body, and a printed circuit board having a hole corresponding to a protruding portion of the heat releasing member.

The light emitting device may be mounted on one outer surface of the printed circuit board, and the protruding portion of the heat releasing member may pass through the hole and face the supporting member that supports the light emitting diode modules.

The protruding portion of the heat releasing member may be in contact with the supporting member.

An auxiliary contact member may be interposed between the protruding portion of the heat releasing member and the supporting member.

The auxiliary contact member may be a gap pad that includes a material containing silicon (Si).

The auxiliary contact member may include carbon graphite.

The printed circuit board may include a base substrate and a wire line portion disposed on the base substrate, and the light emitting device may further include a lead portion that electrically connects the light emitting diode chip to the wire line portion.

According to another embodiment of the present invention, a display device includes a panel assembly that displays an image, a light emitting diode module that supplies light to the panel assembly, an optical member that is interposed between the panel assembly and the light emitting diode module, and supporting members that fix and support the panel assembly, the light emitting diode module, and the optical member. The light emitting diode module includes a light emitting device including a light emitting diode chip, a body that surrounds the light emitting diode chip, and a heat releasing member that is in contact with the light emitting diode chip and protrudes from the body, and a printed circuit board having a hole corresponding to a protruding portion of the heat releasing member.

As a result, it is possible to improve heat releasing efficiency and durability.

BRIEF DESCRIPTION OF THE DRAWINGS

Exemplary embodiments of the present invention can be understood in more detail from the following descriptions with reference to the attached drawings, in which.

DETAILED DESCRIPTION OF THE EXEMPLARY EMBODIMENTS

Exemplary embodiments of the present invention will now be described more fully hereinafter below in more detail with reference to the accompanying drawings. This invention may, however, be embodied in different forms and should not be construed as limited to the embodiments set forth herein.

Figure 1:
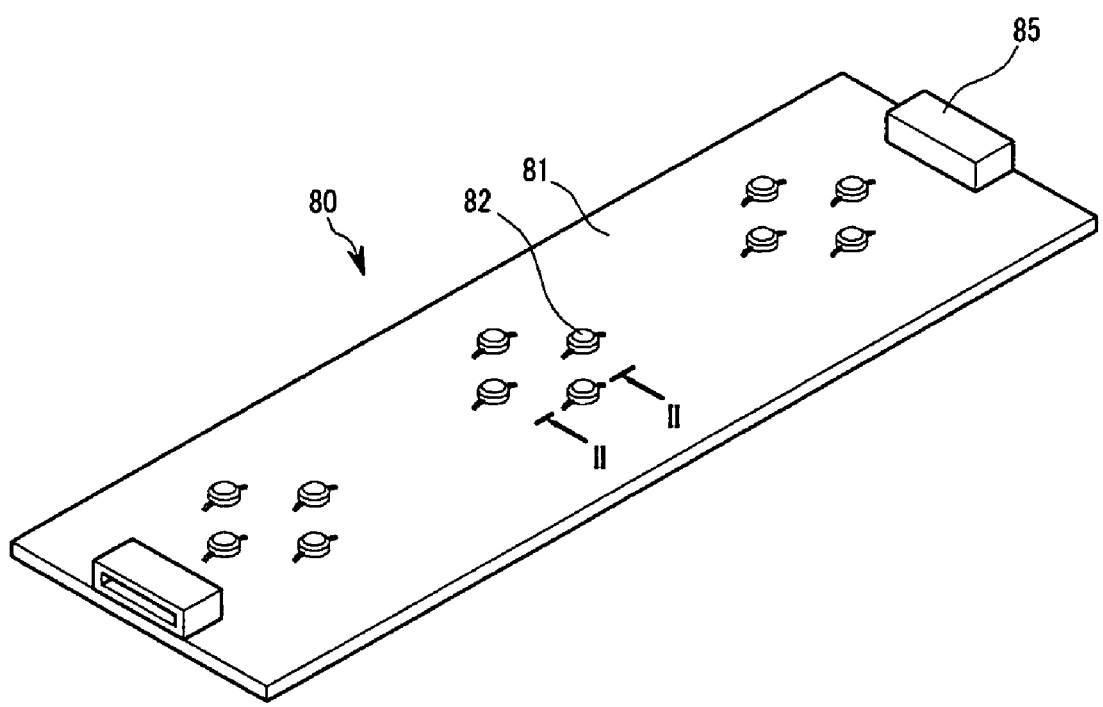
FIG. 1 is a perspective view showing a light emitting diode module according to an embodiment of the present invention.
Figure 2:
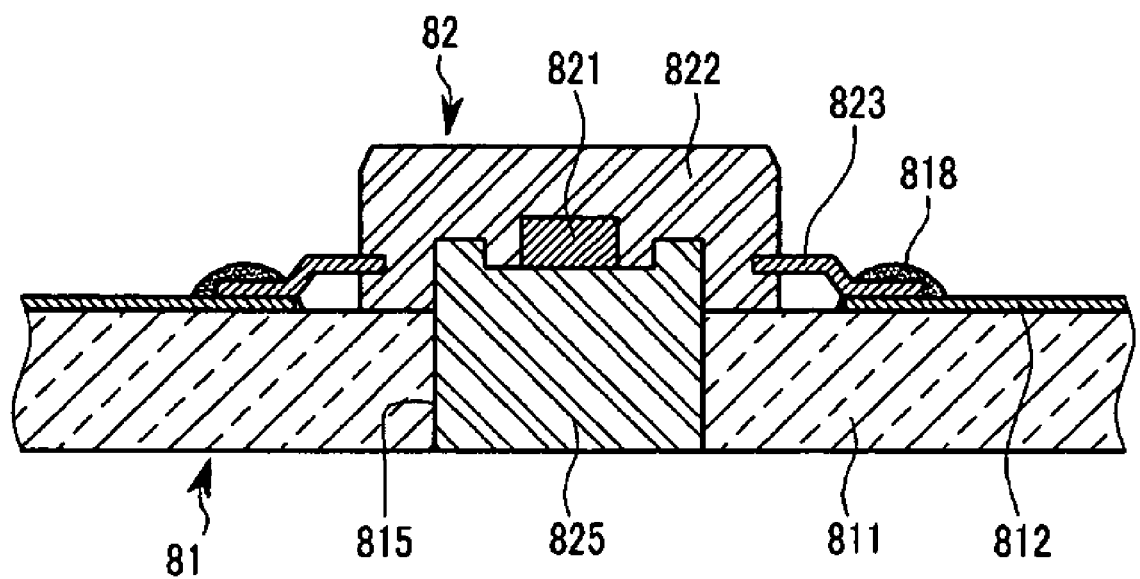
FIG. 2 is a cross-sectional view taken along line II-II of FIG. 1.

FIG. 1 is a perspective view showing a light emitting diode module 80 according to an embodiment of the present invention. FIG. 2 is a cross-sectional view taken along line II-II of FIG. 1.

As shown in FIG. 1, the light emitting diode module 80 includes light emitting devices 82 and a printed circuit board 81 where the light emitting devices 82 are mounted. The printed circuit board 81 includes connectors 85 for electrically connecting the printed circuit board 81 to external circuits. Wire lines or cables 86 (shown in FIG. 4) are connected to the connectors 85, so that the connectors 85 are supplied with power and signals. Solder bumps 818 (shown in FIG. 2) for fixing the light emitting devices 82 are disposed on the printed circuit board 81. As needed, other components may be disposed on the printed circuit board 81.

A plurality of the light emitting devices 82 are mounted on the printed circuit board 81. The light emitting devices 82 are grouped and arrayed. In FIG. 1, four light emitting devices 82 emitting light in three primary colors of red, green, and blue constitute one group. Since brightness of the green light emitted from the light emitting device 82 is lower than the brightness of the red and blue light, two light emitting devices 82 for emitting the green light are disposed in one group in order to compensate for the lower brightness thereof. The colors of the light emitted from the light emitting devices 82 are not limited to the three primary colors of red, green, and blue. Alternatively, only light emitting devices 82 emitting light in white are used, or light emitting devices 82 emitting light in other colors are used.

Now, the light emitting diode module 80 will be described in more detail with reference to FIG. 2.

As shown in FIG. 2, each of the light emitting devices 82 includes a light emitting diode (LED) chip 821, a body 822, and a heat releasing member 825. Each light emitting device 82 further includes lead portions 823.

The light emitting diode chip 821 emits light according to a drive signal. The body 822 surrounds the light emitting diode chip 821 to protect the light emitting diode chip 821, and it may be made of a material such as, for example, an epoxy resin. The heat releasing member 825 contacts the light emitting diode chip 821, and a portion of the heat releasing member protrudes from the body 822. The heat releasing member 825 releases heat generated from the light emitting diode chip 821 so as to prevent deterioration in performance and shortening of the life cycle of the light emitting diode chip 821. The heat releasing member 825 includes a highly thermal conductive material. The lead portions 823 are electrically connected to the light emitting diode chip 821 to transmit the drive signal to the light emitting diode chip 821. Distal ends of the lead portions 823 are connected to the light emitting diode chip 821 through wire lines (not shown) within the body 822. The lead portions 823 may be omitted. If the lead portions 823 are omitted, the light emitting diode chip 821 is in direct contact with the printed circuit board 81 so as to receive the drive signal. The light emitting devices 82 are not limited to the construction shown in FIG. 2, and a multi-color light emitting device having a plurality of lead portions and that emits light in multiple colors may be used.

The printed circuit board 81 includes a base substrate 811 in which holes 815 are formed. Wire line portions 812 are formed on the base substrate 811. A protruding end portion of the heat releasing member 825 of the light emitting device 82 passes through the hole 815 of the printed circuit board 81. More specifically, the light emitting devices 82 are mounted on one side of the printed circuit board 81, and the end portions of the heat releasing member 825 pass through the holes to be exposed on the other side on an outer surface of the printed circuit board 81.

The wire lines 812 are electrically connected to the lead portions of the light emitting device 82 and fixed by using the solder bumps 818. The solder bump 818 is made of a conductive material including, for example, lead (Pb) or tin (Sn). The wire lines 812 may be protected with an insulating film (not shown) covering the wire lines 812.

The printed circuit board 81 is constructed with a general-purpose substrate such as, for example, an epoxy glass substrate, which is referred to as FR4.

The heat generated in emission of the light emitting diode chip 821 can be efficiently released through the heat releasing member 825. Since the heat releasing member 825 passes through the printed circuit board 81 to be exposed on an outer surface of the printed circuit board 81, the heat can be released without interference of the printed circuit board 81.

In addition, since less costly general-purpose substrate, such as, for example, FR4 can be used as the printed circuit board 81, it is possible to increase heat releasing efficiency and production yield.

A light emitting diode module 80 according to another embodiment of the present invention will be described with reference to FIG. 3.

Figure 3:
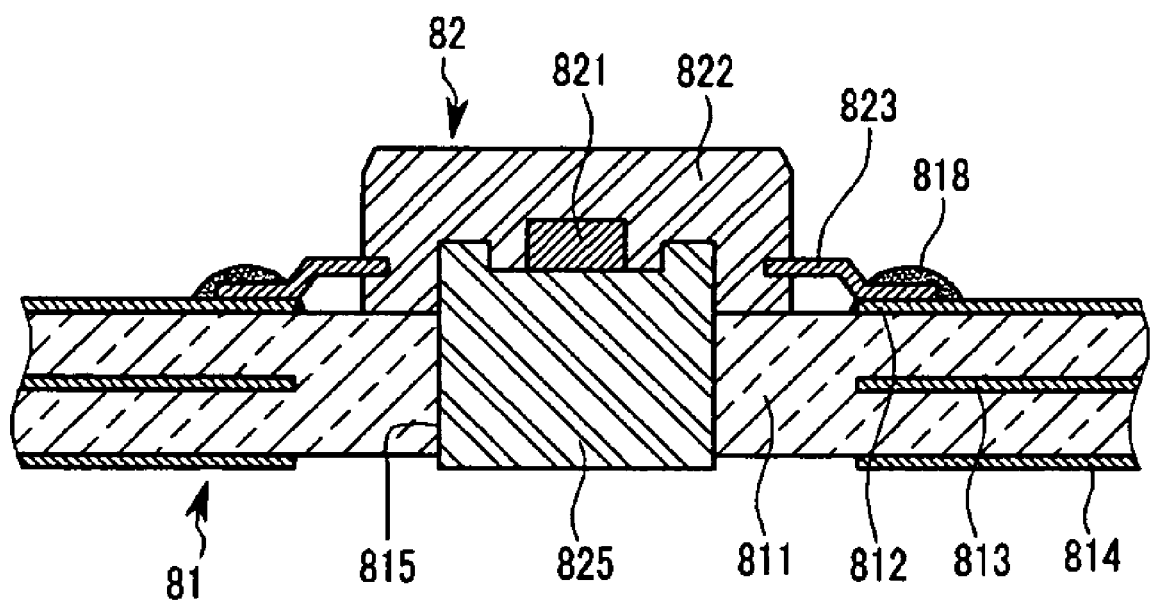
FIG. 3 is a cross-sectional view showing a light emitting diode module according to an embodiment of the present invention.

As shown in FIG. 3, the light emitting diode module 80 includes a printed circuit board 81 constructed with a multi-layered substrate, holes 815, light emitting devices 82 mounted on the printed circuit board 81, and heat releasing members 825 that pass through the holes 815.

The printed circuit board 81 is constructed with a multi-layered substrate including a first wire line portion 812 disposed on a front surface of a base substrate 811, a second wire line portion 813 disposed in an inner portion of the base substrate 811, and a third wire line portion 814 disposed on a rear surface of the base substrate 811. Alternatively, any one of the second wire line portion 813 and the third wire line portion 814 may be omitted. In addition, the second wire line portion 813 may be constructed with multiple layers.

The holes 815 are formed on the base substrate 811 so as to not be obstructed by the first, second, and third wire line portions 812, 813, and 814. The heat releasing members 825 of the light emitting devices 82 pass through the holes 815 to be exposed on an outer surface of the printed circuit board 81.

The heat generated from the light emitting devices 82 disposed on the printed circuit board 81 having a complicated structure can be effectively released. Therefore, it is possible to maximize heat releasing efficiency of a light emitting diode module 80 constructed by mounting the light emitting devices 82 emitting light in multiple colors on the printed circuit board 81 in a high density.

Figure 4:
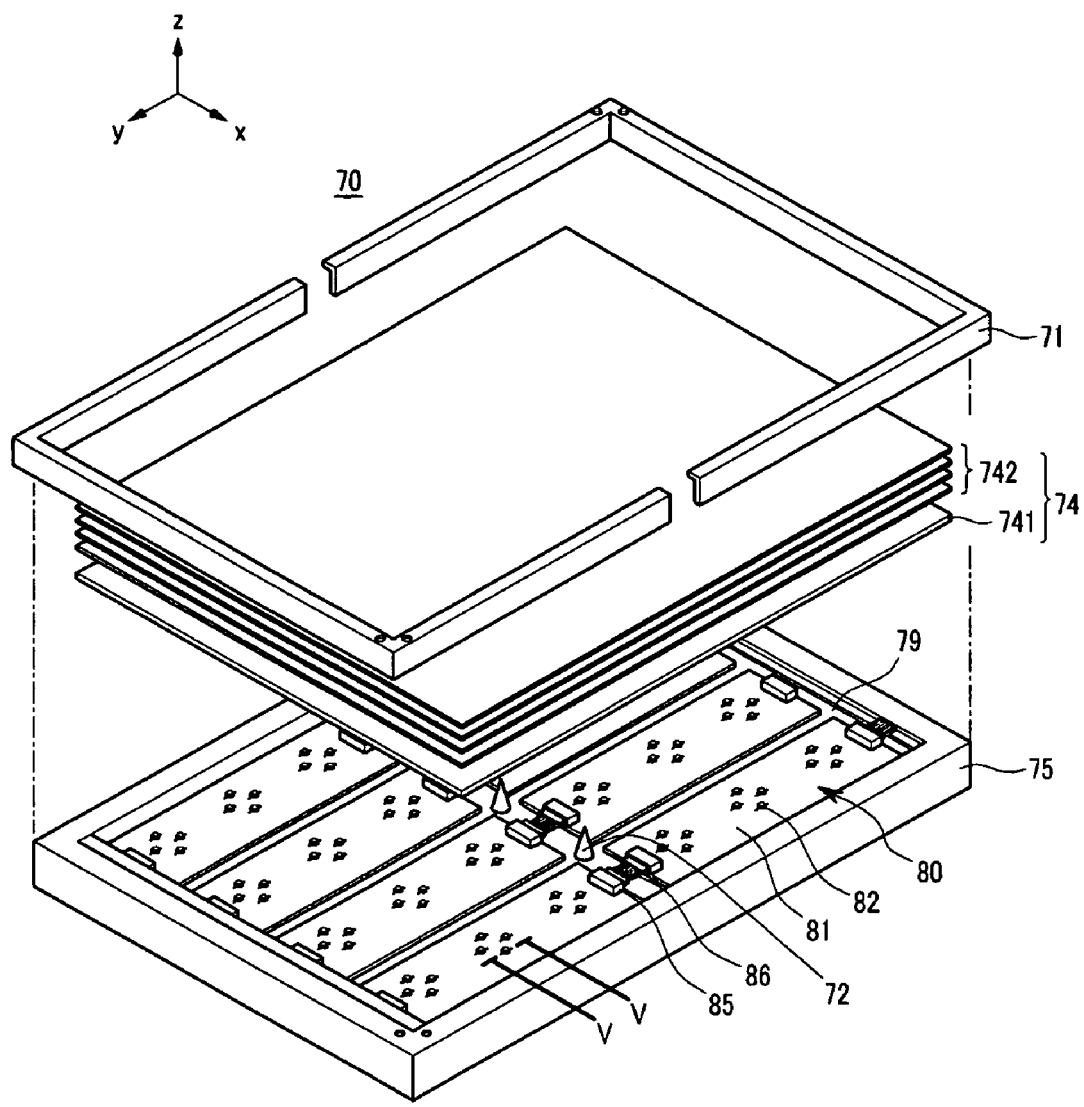
FIG. 4 is an exploded perspective view showing a backlight assembly having a plurality of the light emitting diode modules shown in FIG. 1 according to an embodiment of the present invention.

FIG. 4 shows a backlight assembly 70 having a plurality of the light emitting diode modules 80 shown in FIG. 1. The number of light emitting diode modules 80 constituting the backlight assembly 70 may be changed according to a type and size of the backlight assembly 70.

As shown in FIG. 4, the backlight assembly 70 according to an embodiment of the present invention includes the light emitting diode modules 80, optical members 74, a reflecting sheet 79, and supporting members 71 and 75. In addition, the backlight assembly 70 further includes supporting pillars 72 that support the optical members 74 by separating the optical members 74 from the light emitting diode modules 80. As needed, the backlight assembly 70 may further include other components.

The supporting members include a first supporting member 75 that contains the light emitting diode modules 80, the optical members 74, the reflecting sheet 79, the supporting pillars 72, and a second supporting member 71 that is assembled with the first supporting member 75 to fix these components.

Referring to FIG. 4, the second supporting member 71 is constructed with two partitioned U-shaped portions. Although both the first and second supporting members 75 and 71 are used in the embodiment, the present invention is not limited thereto. Alternatively, one of the first and second supporting members 75 and 71 may be omitted.

The optical members 74 include a diffuser plate 741 for diffusing light emitted from the light emitting diode modules 80 and optical sheets 742 for further increasing brightness of the light passing through the diffuser plate 741.

The optical sheets 742 include a diffuser sheet that diffuses the light passing through the diffuser plate 741 so as to not be partially distributed but to improve uniformity of the light, and a prism sheet that directs the light passing through the diffuser sheet in the vertical direction (i.e., perpendicular to the optical sheets) so as to improve brightness of the light. In addition, the optical sheets may further include a protective sheet that protects the diffuser and prism sheets from dust, scratches, impact, and contaminants.

The reflecting sheet 79 is disposed on an inner surface of the first supporting member 75 containing the light emitting diode modules 80. The reflecting sheet 79 reflects light that emits from the light emitting diode modules 80 to the optical members 74. More specifically, the reflecting sheet 79 is disposed on a portion of the inner surface of the first supporting member 75 that is not in contact with the light emitting diode modules 80. Rear surfaces of the light emitting diode modules 80 are directly in contact with another portion of the inner surface of the first supporting member 75. As a result of this configuration, all or substantially all of the light emitted from the light emitting diode modules 80 is reflected in a direction toward the front surface of the backlight assembly 70, so that it is possible to reduce loss of light, to facilitate diffusion of the light, and to improve uniformity of the light. In addition, such a reflecting sheet 79 may be disposed on the front surface of the printed circuit board 81 in order to increase light reflecting efficiency.

Figure 5:
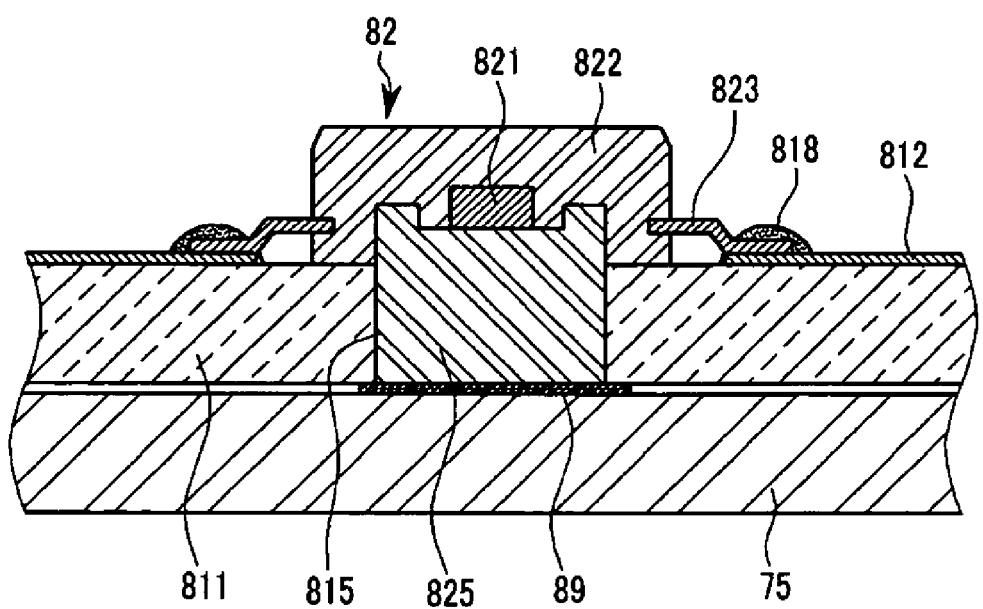
FIG. 5 is a cross-sectional view taken along line V-V of FIG. 4.

FIG. 5 is a cross-sectional view taken along line V-V of FIG. 4.

As shown in FIG. 5, the rear surfaces of the light emitting diode modules 80 are disposed to face the first supporting member 75. Particularly, the protruding end portions of the heat releasing members 825 of the light emitting devices 82 pass through the holes 815 of the printed circuit board 81 and contact the first supporting member 75. The backlight assembly 70 may further include auxiliary contact members 89 that are interposed between the protruding end portions of the heat releasing members 825 and the first supporting member 75. The auxiliary contact members 89 allow the protruding end portions of the heat releasing members 825 to be in stable contact with the first supporting member 75. The auxiliary contact members 89 may have an adhesive property for adhering and fixing the protruding end portions of the heat releasing members 825 and the first supporting member 75. Alternatively, where the protruding end portions of the heat releasing members 825 are in stable contact with the first supporting member 75, the auxiliary contact members 89 may be omitted.

The auxiliary contact members 89 may be, for example, gap pads that are made of a material containing, for example, silicon (Si). Alternatively, the auxiliary contact members 89 are made of, for example, carbon graphite.

Figure 6:
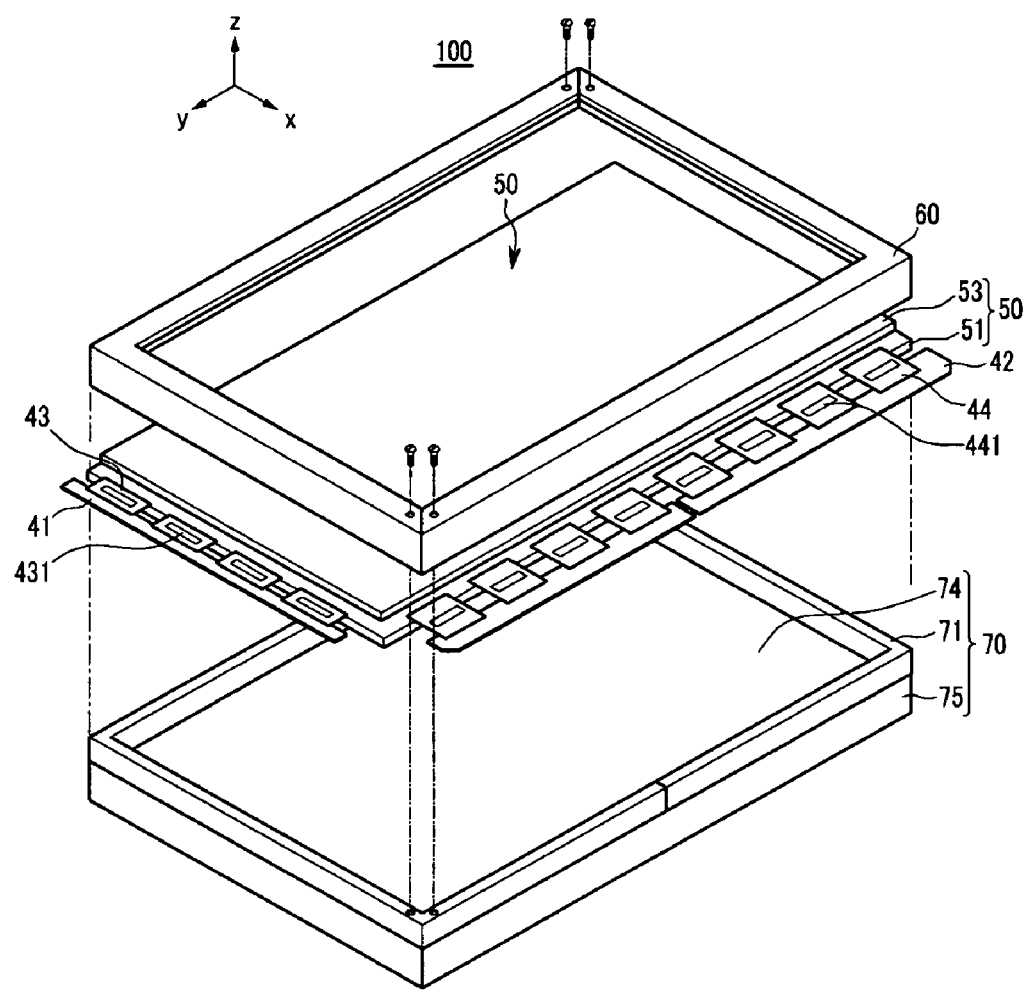
FIG. 6 is an exploded perspective view showing a display device having the backlight assembly of FIG. 4 according to an embodiment of the present invention.

FIG. 6 shows a display device 100 having the backlight assembly 70 according to an embodiment of the present invention.

In FIG. 6, a liquid crystal display panel is used as the panel assembly 50 used for the display device 100. However, the present invention is not limited thereto. Alternatively, other non-emission types of display panels may be used for the display device.

As shown in FIG. 6, the display device 100 includes a backlight assembly 70 for supplying light, and the panel assembly 50 for displaying an image by using the supplied light. In addition, the display device 100 includes a third supporting member 60 for supporting and fixing the panel assembly 50 in the backlight assembly 70. As needed, the display device 100 may include other components.

In addition, the display device 100 further includes drive printed circuit boards (PCBs) 41 and 42 electrically connected to the panel assembly 50 so as to transmit driving signals, and drive integrated circuit (IC) chip packages 43 and 44 for electrically connecting the drive printed circuit boards 41 and 42 to the panel assembly 50. As an example of the drive IC chip packages 43 and 44, a COF (chip on film) or a TCP (tape carrier package) may be used. The drive printed circuit boards include a gate drive printed circuit board 41 and a data drive printed circuit board 42. The drive IC chip packages include a gate drive IC chip package 43 for connecting the panel assembly 50 to the gate drive printed circuit board 41 and a data drive IC chip package 44 for connecting the panel assembly 50 and the data drive printed circuit board 42.

The panel assembly 50 includes a first panel 51, a second panel 53 facing the first panel 51, and a liquid crystal layer 52 (shown in FIG. 8) interposed between the first and second panels 51 and 53. The first and second panels 51 and 53 are rear and front substrates, respectively. The first panel 51 is connected to the drive IC chip packages 43 and 44. The gate drive IC chip package 43 is attached on one edge of the first panel 51. The gate drive IC chip package 43 includes integrated circuit (IC) chips 431 constituting a gate driver 400 shown in FIG. 7. The data drive IC chip package 44 is attached on another edge of the first panel 51. The data drive IC chip package 44 includes IC chips 441 constituting a data driver 500 and a gray voltage generator 800 shown in FIG. 7.

The panel assembly 50 and a construction for driving the panel assembly 50 are described in further detail with reference to FIGS. 7 and 8.

Figure 7:
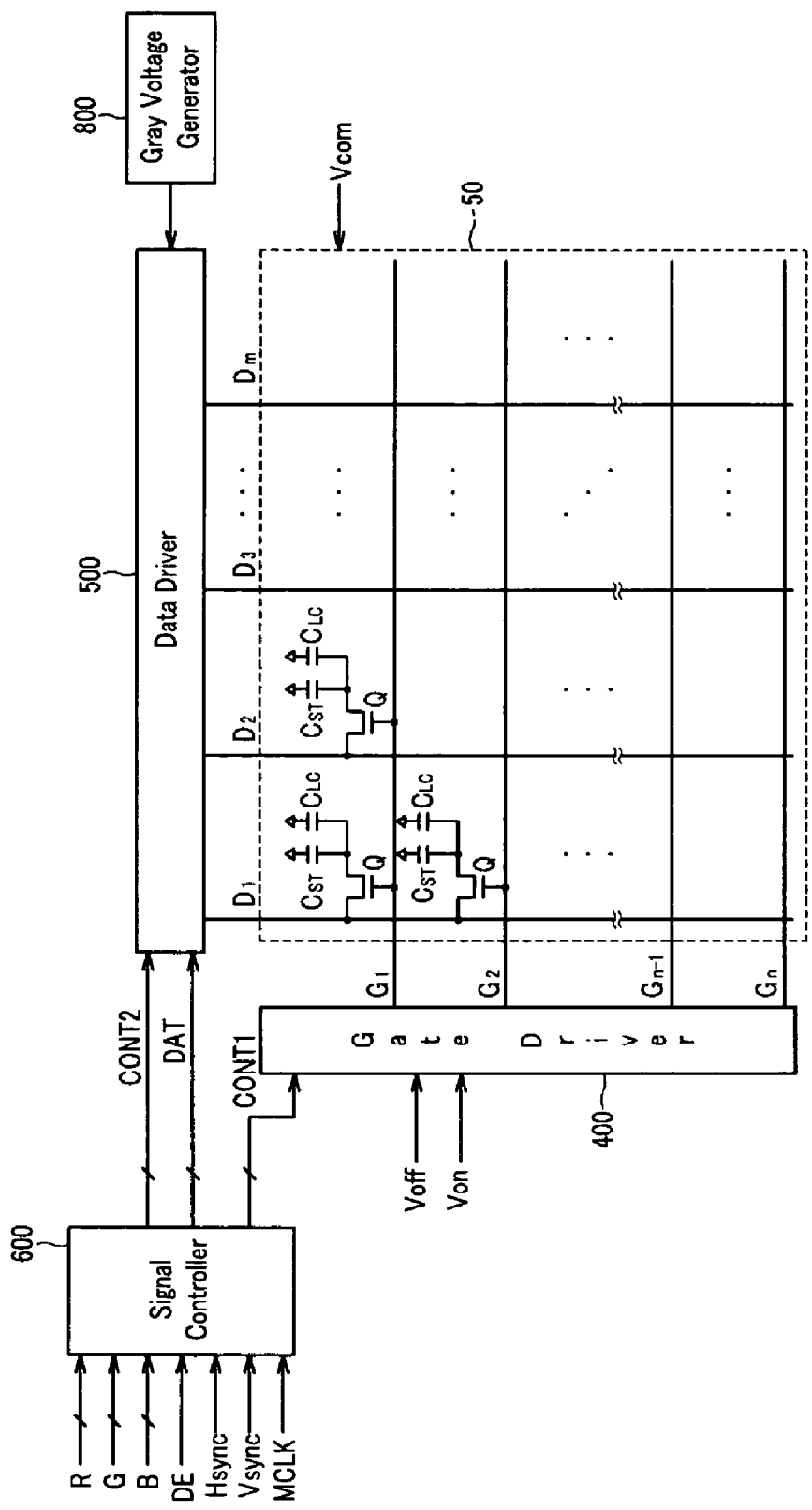
FIG. 7 is a block diagram showing a construction of a panel assembly of the display unit of FIG. 6 according to an embodiment of the present invention.
Figure 8:
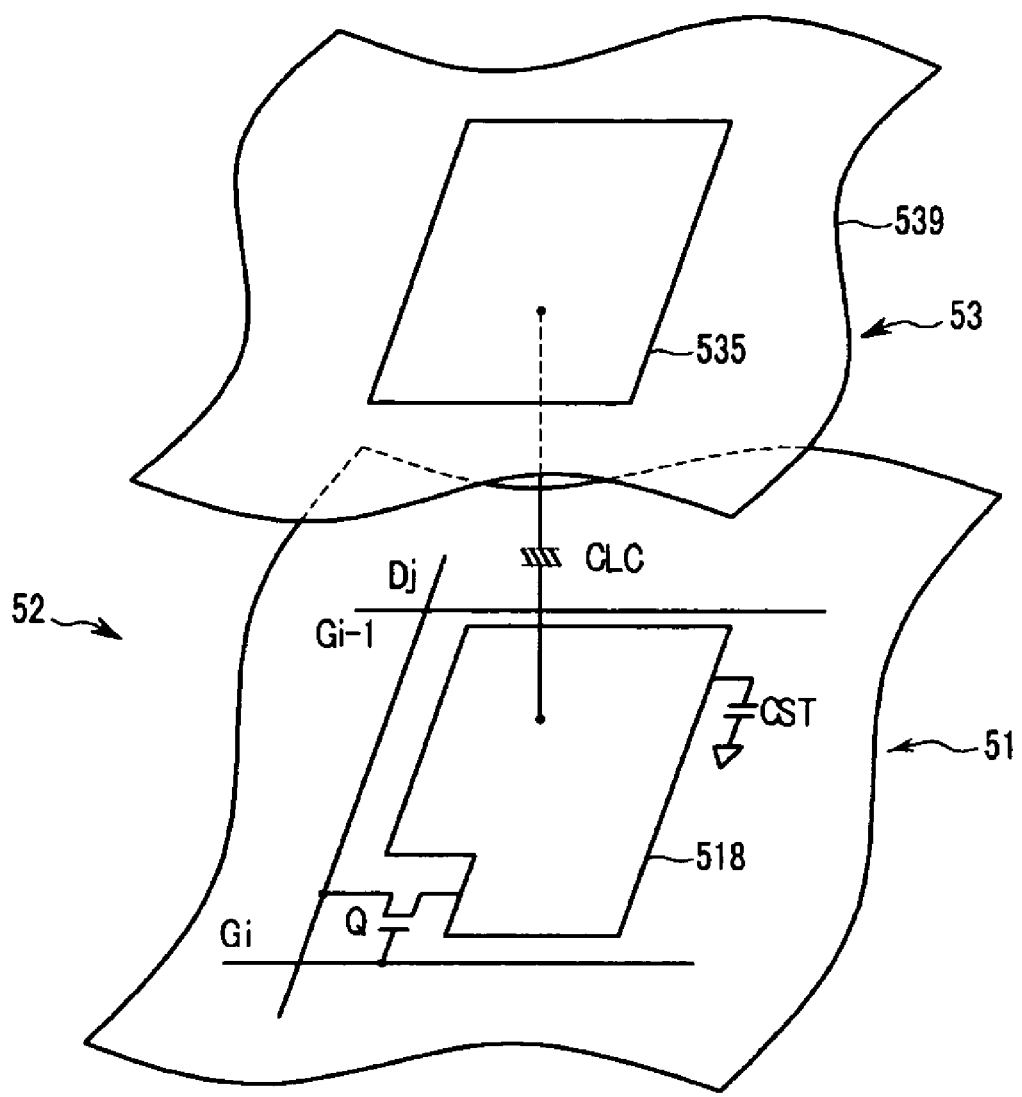
FIG. 8 is an equivalent circuit view showing a pixel of the panel assembly of FIG. 7 according to an embodiment of the present invention.

As shown in FIGS. 7 and 8, the first panel 51 comprises a plurality of signal lines $G_1$ to $G_n$ and $D_1$ to $D_m$. The first panel 51 and a second panel 53 are connected to the signal lines $G_1$ to $G_n$ and $D_1$ to $D_m$, and comprise a plurality of pixels arrayed in a matrix shape.

The signal lines $G_1$ to $G_n$ and $D_1$ to $D_m$ comprise a plurality of gate lines $G_1$ to $G_n$ for delivering gate signals (also called "scanning signals) and a plurality of data lines $D_1$ to $D_m$ for delivering data signals. The gate lines $G_1$ to $G_n$ are extended in approximately a row direction and are substantially parallel to each other, and the data lines $D_1$ to $D_m$ are extended in approximately a column direction and are substantially parallel to each other.

Each pixel comprises a switching element Q connected to the signal lines $G_1$ to $G_n$ and $D_1$ to $D_m$, a liquid crystal capacitor $C_{LC}$ connected to the switching element Q, and a storage capacitor $C_{ST}$. The storage capacitor $C_{ST}$ may be omitted.

The switching element Q is a type of thin film transistor, and is formed on the first panel 51. The thin film transistor is a device having three terminals, which are a control terminal that is connected to the gate lines $G_1$ to $G_n$, an input terminal that is connected to the data lines $D_1$ to $D_m$, and an output terminal that is connected to the liquid crystal capacitor $C_{LC}$ and the storage capacitor $C_{ST}$.

The signal controller 600 controls operations of the gate driver 400 and the data driver 500. A gate driver 400 applies gate signals that are composed of a gate ON voltage $V_{on}$ and a gate OFF voltage $V_{off}$ to the gate lines $G_1$ to $G_n$, and the data driver 500 applies data voltages to the data lines $D_1$ to $D_m$. The gray voltage generator 800 generates two sets of grayscale voltages related to transmissivity of the pixel, and then delivers the grayscale voltages to the data driver 500 as data voltages. One set has the positive value with respect to the common voltage $V_{com}$, and the other set has the negative value.

As shown in FIG. 8, the liquid crystal capacitor $C_{LC}$ has two electrodes, that is, a pixel electrode 518 of the first panel 51 and a common electrode 539 of the second panel 53, and a liquid crystal layer 52 interposed between two electrodes 518 and 539 functions as a dielectric layer. The pixel electrode 518 is connected to the switching element Q, and the common electrode 539 is formed over the front side of the second panel 53 and is applied with the common voltage $V_{com}$. As an alternative to the configuration shown in FIG. 8, the common electrode 539 may be formed on the first panel 51, and any one of two electrodes 519 and 539 may be formed in the shape of a line or bar. In addition, color filters 535 for transmitting predetermined light in colors are disposed on the second panel 53. As an alternative to the configuration shown in FIG. 8, the first panel 51 may also be provided with the color filters 535.

The storage capacitor CST is auxiliary to the liquid crystal capacitor $C_{LC}$ and includes a separate signal line (not shown) provided on the first panel 51 and a pixel electrode 518, wherein an insulation layer is used as a medium. A fixed voltage, such as the common voltage $V_{com}$, is applied to the separate signal line. Alternatively, the storage capacitor $C_{ST}$ may be composed of the pixel electrode 518 and the gate lines $G_1$ to $G_n$ using an insulation layer as a medium.

A polarizer (not shown) for polarizing light is attached to the outside of at least one of two panels 51 and 53 of the panel assembly 50.

If a switching element, that is, a thin film transistor, is turned ON, an electric field is formed between the pixel electrode 518 and the common electrode 539. Such an electric field changes an alignment angle of liquid crystal molecules of the liquid crystal layer 53 formed between the first panel 51 and the second panel 53, so that desired images can be obtained according to the changed light transmission level.

Accordingly, since the display device 100 according to the embodiment of the present invention employs the light emitting diode module 80 and the backlight assembly 70 having the light emitting diode module 80, it is possible to improve durability of the display device 100.

As described above, according to the embodiments of the present invention, it is possible to improve heat releasing efficiency and durability of a light emitting diode module.

Namely, heat generated from a light emitting chip during emission of light can be efficiently released. Since the heat releasing member passes through the printed circuit board to be exposed to an outer portion of the printed circuit board, the heat can be released without interference of the printed circuit board.

In addition, the heat generated from the light emitting devices disposed on the printed circuit board having a complicated structure can be effectively released. Therefore, it is possible to maximize heat releasing efficiency of the light emitting diode module constructed by mounting light emitting devices emitting light in multiple colors on the printed circuit board 81 with a high density.

Since an inexpensive general-purpose substrate can be used as the printed circuit board, it is possible to increase heat releasing efficiency and production yield.

Further, it is possible improve heat releasing efficiency and durability of the entire backlight assembly and display device having the light emitting diode module.

Although the exemplary embodiments have been described herein with reference to the accompanying drawings, the present invention is not limited to these embodiments, but may be modified in various forms without departing from the spirit or scope of the invention. All such changes and modifications are intended to be included within the scope of the invention as defined by the appended claims.

What is claimed is:

1. A light emitting diode module, comprising:
   a light emitting device including a light emitting diode chip, a body surrounding the light emitting diode chip, and a heat releasing member in contact with the light emitting diode chip and protruding from the body; and
   a printed circuit board having a hole corresponding to a protruding portion of the heat releasing member, wherein the printed circuit board includes a base substrate and a wire line portion disposed on a surface of the base substrate.

2. The light emitting diode chip of claim 1, wherein the light emitting device is mounted on a surface of the printed circuit board, and wherein the protruding portion of the heat releasing member passes through the hole.

3. The light emitting diode chip of claim 1, wherein the light emitting device further includes a lead portion electrically connecting the light emitting diode chip to the wire line portion.

4. A light emitting diode module, comprising:
a light emitting device including a light emitting diode chip, a body surrounding the light emitting diode chip, and a heat releasing member in contact with the light emitting diode chip and protruding from the body; and
a printed circuit board having a hole corresponding to a protruding portion of the heat releasing member, wherein the printed circuit board includes a base substrate and a wire line portion disposed on two surfaces of the base substrate.

5. A light emitting diode module, comprising:
a light emitting device including a light emitting diode chip, a body surrounding the light emitting diode chip, and a heat releasing member in contact with the light emitting diode chip and protruding from the body; and
a printed circuit board having a hole corresponding to a protruding portion of the heat releasing member, wherein the printed circuit board includes a base substrate and a wire line portion disposed in an inner portion of the base substrate.

6. A backlight assembly, comprising:
at least one light emitting diode module that emits light,
an optical member that diffuses the light, and
a supporting member containing and supporting the light emitting diode modules and the optical member,
wherein each of the light emitting diode modules comprises:
a light emitting device including a light emitting diode chip, a body surrounding the light emitting diode chip, and a heat releasing member in contact with the light emitting diode chip and protruding from the body; and
a printed circuit board having a hole corresponding to a protruding portion of the heat releasing member.

7. The backlight assembly of claim 6, wherein the light emitting device is mounted on a surface of the printed circuit board, and wherein the protruding portion of the heat releasing member passes through the hole and faces the supporting member.

8. The backlight assembly of claim 7, wherein the protruding portion of the heat releasing member contacts the supporting member.

9. The backlight assembly of claim 7, wherein an auxiliary contact member is interposed between the protruding portion of the heat releasing member and the supporting member.

10. The backlight assembly of claim 9, wherein the auxiliary contact member is a gap pad including silicon.

11. The backlight assembly of claim 9, wherein the auxiliary contact member includes carbon graphite.

12. The backlight assembly of claim 6, wherein the printed circuit board includes a base substrate and a wire line portion disposed on the base substrate, and wherein the light emitting device further includes a lead portion electrically connecting the light emitting diode chip to the wire line portion.

13. A display device, comprising:
a panel assembly that displays an image,
a light emitting diode module that supplies light to the panel assembly, an optical member interposed between the panel assembly and the light emitting diode module, and supporting members fixing and supporting the panel assembly, the light emitting diode module, and the optical member,
wherein the light emitting diode module comprises:
a light emitting device including a light emitting diode chip, a body surrounding the light emitting diode chip, and a heat releasing member in contact with the light emitting diode chip and protruding from the body; and
a printed circuit board having a hole corresponding to a protruding portion of the heat releasing member.

14. The display device of claim 13, wherein the light emitting device is mounted on a surface of the printed circuit board, and wherein the protruding portion of the heat releasing member passes through the hole and faces a supporting member supporting the light emitting diode modules.

15. The display device of claim 14, wherein the protruding portion of the heat releasing member contacts the supporting member.

16. The display device of claim 14, wherein an auxiliary contact member is interposed between the protruding portion of the heat releasing member and the supporting member.

17. The display device of claim 16, wherein the auxiliary contact member is a gap pad including silicon.

18. The display device of claim 16, wherein the auxiliary contact member includes carbon graphite.

19. The display device of claim 13, wherein the printed circuit board includes a base substrate and a wire line portion disposed on the base substrate, and wherein the light emitting device further includes a lead portion electrically connecting the light emitting diode chip to the wire line portion.

* * * * *